US010134679B2

(12) United States Patent
Kim et al.

(10) Patent No.: US 10,134,679 B2
(45) Date of Patent: Nov. 20, 2018

(54) PRINTED CIRCUIT BOARD, PACKAGE SUBSTRATE COMPRISING SAME, AND METHOD FOR MANUFACTURING SAME

(71) Applicant: LG INNOTEK CO., LTD., Seoul (KR)

(72) Inventors: Dong Sun Kim, Seoul (KR); Sung Wuk Ryu, Seoul (KR); Ji Haeng Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 15/117,373

(22) PCT Filed: Jan. 28, 2015

(86) PCT No.: PCT/KR2015/000909
§ 371 (c)(1),
(2) Date: Aug. 8, 2016

(87) PCT Pub. No.: WO2015/119397
PCT Pub. Date: Aug. 13, 2015

(65) Prior Publication Data
US 2016/0351506 A1    Dec. 1, 2016

(30) Foreign Application Priority Data

Feb. 6, 2014    (KR) ........................ 10-2014-0013469

(51) Int. Cl.
*H01L 23/538*    (2006.01)
*H01L 25/10*    (2006.01)
(Continued)

(52) U.S. Cl.
CPC ........ *H01L 23/5389* (2013.01); *H01L 21/486* (2013.01); *H01L 21/4853* (2013.01);
(Continued)

(58) Field of Classification Search
None
See application file for complete search history.

(56) References Cited

U.S. PATENT DOCUMENTS

| 5,439,162 A | 8/1995 | George et al. |
| 7,768,115 B2 | 8/2010 | Lee et al. |

(Continued)

FOREIGN PATENT DOCUMENTS

| CN | 102543908 | 7/2012 |
| JP | 2009-099749 | 5/2009 |
| KR | 10-2011-0105364 | 9/2011 |

OTHER PUBLICATIONS

International Search Report (with English Translation) and Written Opinion dated May 29, 2015 issued in Application No. PCT/KR2015/000909.

(Continued)

*Primary Examiner* — Charles Garber
*Assistant Examiner* — Alia Sabur
(74) *Attorney, Agent, or Firm* — KED & Associates, LLP (57) ABSTRACT

The printed circuit board, according to one embodiment, comprises: an insulation substrate; a pad formed on at least one side of the insulation substrate; a protection layer which is formed on the insulation substrate and exposes an upper surface of the pad; and a bump formed on the pad exposed by the protection layer, wherein the bump comprises a plurality of solder layers having melting points different from each other.

9 Claims, 5 Drawing Sheets

(51) Int. Cl.
*H01L 25/00* (2006.01)
*H05K 3/34* (2006.01)
*H01L 23/498* (2006.01)
*H01L 21/48* (2006.01)
*H01L 23/31* (2006.01)
*H01L 23/00* (2006.01)
*H01L 25/065* (2006.01)
*H05K 3/40* (2006.01)

(52) U.S. Cl.
CPC .... *H01L 21/4857* (2013.01); *H01L 23/49816* (2013.01); *H01L 23/49822* (2013.01); *H01L 23/5383* (2013.01); *H01L 23/5384* (2013.01); *H01L 23/5386* (2013.01); *H01L 25/105* (2013.01); *H01L 25/50* (2013.01); *H05K 3/3463* (2013.01); *H01L 23/3128* (2013.01); *H01L 24/16* (2013.01); *H01L 24/48* (2013.01); *H01L 24/73* (2013.01); *H01L 25/0657* (2013.01); *H01L 2224/0401* (2013.01); *H01L 2224/04042* (2013.01); *H01L 2224/16237* (2013.01); *H01L 2224/32145* (2013.01); *H01L 2224/48091* (2013.01); *H01L 2224/48227* (2013.01); *H01L 2224/73265* (2013.01); *H01L 2225/0651* (2013.01); *H01L 2225/06568* (2013.01); *H01L 2225/1023* (2013.01); *H01L 2225/1035* (2013.01); *H01L 2225/1058* (2013.01); *H01L 2924/15311* (2013.01); *H01L 2924/15331* (2013.01); *H05K 3/4007* (2013.01); *H05K 2201/0338* (2013.01); *H05K 2201/041* (2013.01)

(56) References Cited

U.S. PATENT DOCUMENTS

| | | |
|---|---|---|
| 2002/0053467 A1 | 5/2002 | Gebauer et al. |
| 2005/0214971 A1* | 9/2005 | Hung ............... H01L 21/563 438/106 |
| 2007/0164457 A1* | 7/2007 | Yamaguchi ......... H01L 23/5389 257/787 |
| 2008/0284001 A1* | 11/2008 | Mori ............... H01L 21/4853 257/712 |
| 2009/0065950 A1 | 3/2009 | Lee et al. |
| 2011/0227209 A1 | 9/2011 | Yoon et al. |
| 2014/0035131 A1* | 2/2014 | Noh ............... H01L 23/49811 257/737 |
| 2014/0183731 A1* | 7/2014 | Lin ............... H01L 23/49827 257/738 |
| 2015/0076691 A1* | 3/2015 | Kim ............... H01L 23/49822 257/738 |
| 2015/0091150 A1* | 4/2015 | Lin ............... H01L 23/49811 257/686 |
| 2016/0144460 A1* | 5/2016 | Burda ............... B23K 35/36 428/634 |

OTHER PUBLICATIONS

Chinese Office Action dated Jun. 19, 2018 issued in Application No. 2015800177714 (with English Translation).

\* cited by examiner

PRINTED CIRCUIT BOARD, PACKAGE SUBSTRATE COMPRISING SAME, AND METHOD FOR MANUFACTURING SAME

CROSS-REFERENCE TO RELATED PATENT APPLICATIONS

This application is a U.S. National Stage Application under 35 U.S.C. § 371 of PCT Application No. PCT/KR2015/000909, filed Jan. 28, 2015, which claims priority to Korean Patent Application No. 10-2014-0013469, filed Feb. 6, 2014, whose entire disclosures are hereby incorporated by reference.

TECHNICAL FIELD

The present invention relates to a printed circuit board, a package substrate comprising the same, and a method for manufacturing the same.

BACKGROUND ART

In general, a package substrate has a form in which a first substrate having a memory chip attached thereto and a second substrate having a processor chip attached thereto are connected as one.

The package substrate has advantages in that, as the processor chip and the memory chip are manufactured as one package, the mounting area of the chips can be reduced, and a signal can be transmitted at a high speed through a short path.

Due to this advantage, the package substrate is widely used in mobile devices, and the like.

Figure 1:
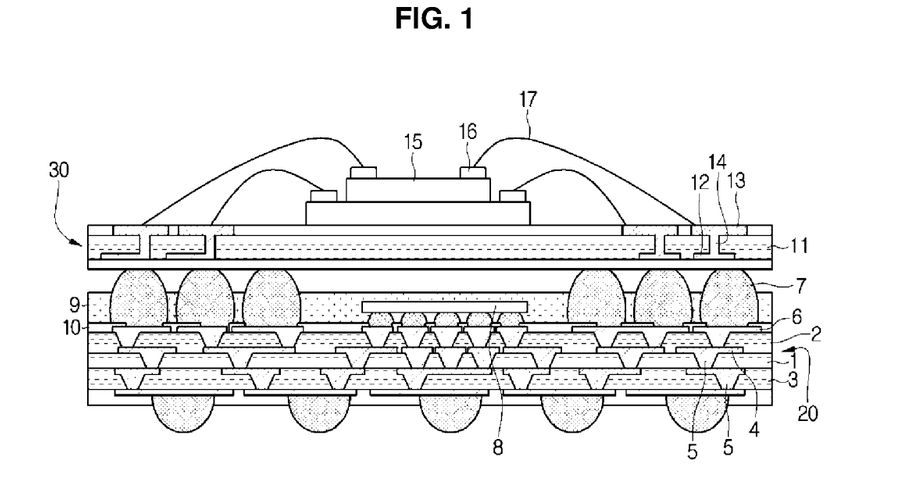
FIG. 1 is a sectional view illustrating a package substrate according to a related art.

FIG. 1 is a sectional view illustrating a package substrate according to a related art.

Referring to FIG. 1, the package substrate includes a first substrate 20 and a second substrate 20 attached onto the first substrate 20.

The first substrate 20 includes a first insulating layer 1, circuit patterns 4 formed on at least one surface of the first insulating layer 1, a second insulating layer 2 formed on the first insulating layer 2, a third insulating layer 3 formed under the first insulating layer 1, a conductive via 5 formed inside at least one of the first insulating layer 1, the second insulating layer 2, and the third insulating layer 3, a pad 6 formed on an upper surface of the second insulating layer 2, a plurality of bonding pates 7 formed on the pad 6, a memory chip 8 formed on at least one bonding paste 7 among the plurality of bonding pastes 7, a first protective layer 10 exposing a partial upper surface of the pad 6 therethrough, and a second protective layer 9 formed on the first protective layer 10 to cover the memory chip 8.

In addition, the second substrate 30 includes a fourth insulating layer 11, a circuit pattern 12 formed on at least one surface of the fourth insulating layer 11, a pad 13 formed on at least one surface of the fourth insulating layer 11, a conductive via 14 formed inside the fourth insulating layer 11, a processor chip 15 formed on the fourth insulating layer 11, an electrode 16 formed on the processor chip 15, and a connection member S connecting the electrode 16 to the pad 13.

The package substrate according to the related art shown in FIG. 1 illustrates a schematic view of a package on package (PoP) to which a through mold via (TMV) technology based on a laser technology is applied.

According to the TMV technology, after the first substrate 20 is molded, a conductive via connected to a pad is formed through a laser process, and accordingly, a solder ball (bonding paste) is printed in the conductive via.

In addition, the second substrate 30 is attached onto the first substrate 20 by the printed solder ball.

However, the related art has a limitation in forming a fine pitch because the first substrate is connected to the second substrate using the solder ball.

DISCLOSURE OF THE INVENTION

Technical Problem

Embodiments provide a printed circuit board having a novel structure.

Embodiments also provide a printed circuit board in which a fine pitch can be easily formed.

Embodiments also provide a package substrate having a bump structure capable of absorbing stresses generated in an upper substrate and stresses generated in a lower substrate.

Technical objects to be achieved in the present invention are not limited to the mentioned technical objects, and those skilled in the art may clearly understand another non-mentioned technical object from the description of the present invention below.

Technical Solution

According to an embodiment of the present invention, there is provided a printed circuit board including: an insulating substrate; a pad formed on at least one surface of the insulating substrate; a protective layer formed on the insulating substrate, the protective layer having an opening exposing an upper surface of the pad therethrough; and a bump formed on the pad exposed by the protective layer, wherein the bump comprises a plurality of solder layers having different melting points.

In addition, the bump protrudes upward of a surface of the protective layer.

Further, the bump includes: a first solder layer formed on the pad; a metal layer formed on the first solder layer; and a second solder layer formed on the metal layer.

In addition, the melting point of the first solder layer is higher than that of the second solder layer.

In addition, the first solder layer is formed as a material having a heterogeneous element comprising at least one selected from the group consisting of Al, Sb, Bi, Cu, Ni, In, Pb, Ag, Sn, Zn, Ga, Cd, and Fe is contained in a solder comprising at least one of SnCu, SnPb, and SnAgCu.

In addition, the second solder layer is formed as a material having a heterogeneous element comprising at least one selected from the group consisting of Al, Sb, Bi, Cu, Ni, In, Pb, Ag, Sn, Zn, Ga, Cd, and Fe is contained in a solder comprising at least one of SnCu, SnPb, and SnAgCu.

In addition, the bump further includes: a first surface treatment layer formed between the first solder layer and the metal layer; and a second surface treatment layer formed between the metal layer and the second solder layer.

Meanwhile, according to an embodiment of the present invention, there is provided a package substrate including: a lower substrate having a first chip mounted thereon; and an upper substrate formed on the lower substrate, the upper substrate having a second chip mounted thereon, wherein at least one of the lower substrate and the upper substrate includes: a pad; a first solder layer formed on the pad; a metal layer formed on the first solder layer; and a second solder layer formed on the metal layer.

In addition, the melting point of the first solder layer is higher than that of the second solder layer.

Further, the first solder layer is formed as a material having a heterogeneous element comprising at least one selected from the group consisting of Al, Sb, Bi, Cu, Ni, In, Pb, Ag, Sn, Zn, Ga, Cd, and Fe is contained in a solder comprising at least one of SnCu, SnPb, and SnAgCu.

In addition, the second solder layer is formed as a material having a heterogeneous element comprising at least one selected from the group consisting of Al, Sb, Bi, Cu, Ni, In, Pb, Ag, Sn, Zn, Ga, Cd, and Fe is contained in a solder comprising at least one of SnCu, SnPb, and SnAgCu.

In addition, the package substrate further includes: a first surface treatment layer formed between the first solder layer and the metal layer; and a second surface treatment layer formed between the metal layer and the second solder layer.

Meanwhile, according to an embodiment of the present invention, there is provided a method for manufacturing a package substrate, the method including: preparing a base substrate; forming a pad on at least one surface of the prepared base substrate; forming, on the base substrate, a protective layer having an opening exposing a surface of the formed pad therethrough; forming, on the protective layer, a mask having a window exposing the surface of the formed pad; and forming, on the pad, a bump buried in the opening and the window, wherein the formed bump comprises a plurality of solder layers having different melting points.

In addition, the forming of the bump on the pad includes: forming a first solder layer on the pad; forming a metal layer on the first solder layer; and forming a second solder layer on the metal layer.

Further, the melting point of the first solder layer is higher than that of the second solder layer.

In addition, the first solder layer is formed as a material having a heterogeneous element comprising at least one selected from the group consisting of Al, Sb, Bi, Cu, Ni, In, Pb, Ag, Sn, Zn, Ga, Cd, and Fe is contained in a solder comprising at least one of SnCu, SnPb, and SnAgCu.

In addition, the second solder layer is formed as a material having a heterogeneous element comprising at least one selected from the group consisting of Al, Sb, Bi, Cu, Ni, In, Pb, Ag, Sn, Zn, Ga, Cd, and Fe is contained in a solder comprising at least one of SnCu, SnPb, and SnAgCu.

The forming of the bump further includes: forming a first surface treatment layer between the first solder layer and the metal layer; and forming a second surface treatment layer between the metal layer and the second solder layer.

In addition, the method further includes performing a reflow process based on the melting point of the second solder layer, thereby attaching an upper substrate onto the second solder layer. In the reflow process, the shape of the first solder layer is maintained as it is.

Advantageous Effects

According to the embodiments of the present invention, a bump including a plurality of solders having different melting characteristics is provided at an upper end of the lower substrate, so that any separate solder is not necessary for the upper substrate. Accordingly, an assembly process can be simplified, and simultaneously, the added value of substrate manufacturers can be increased.

In addition, according to the embodiments of the present invention, solders are formed at a bonding portion of the upper substrate and the lower substrate with the metal layer interposed therebetween, so that stresses applied to the entire package substrate can be absorbed by the solders. Accordingly, it is possible to prevent damage of the package substrate.

In addition, according to the embodiments of the present invention, a bump having a metal post structure is provided, so that a fine pitch can be formed.

BEST MODE FOR CARRYING OUT THE INVENTION

Hereinafter, embodiments of the present invention will be described in detail with reference to accompanying drawings so that those skilled in the art can easily work with the embodiments. However, the present invention can be implemented in various manners, and thus should not be construed to be limited to the embodiments disclosed herein.

In the following description, when a predetermined part "includes" a predetermined component, the predetermined part does not exclude other components, but may further include other components unless indicated otherwise.

The thickness and size of each layer shown in the drawings may be exaggerated, omitted or schematically drawn for the purpose of convenience or clarity. In addition, the size of elements does not utterly reflect an actual size. The same reference numbers will be assigned the same elements throughout the drawings.

In the description of the embodiments, it will be understood that, when a layer (or film), a region, or a plate is referred to as being "on" another part, it can be "directly" or "indirectly" over the other part, or one or more intervening layers may also be present. On the contrary, it will be understood that, when a certain part is referred to as being "directly on" another part, one or more intervening layers may be absent.

Figure 2:
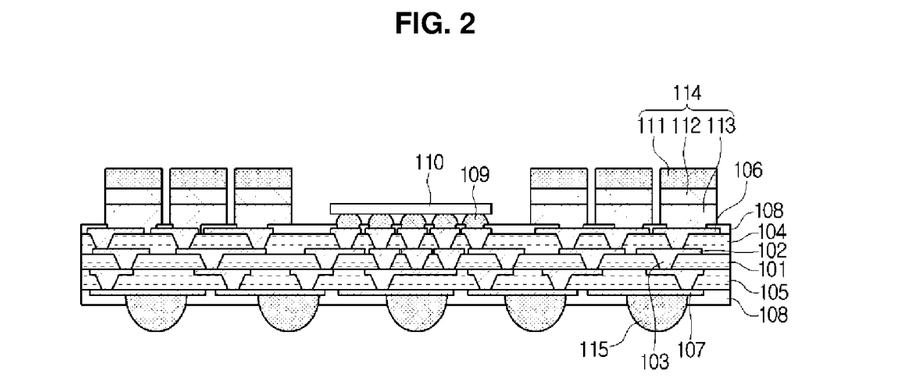
FIG. 2 is a view illustrating a printed circuit board according to an embodiment of the present invention.

FIG. 2 is a view illustrating a printed circuit board according to an embodiment of the present invention.

Hereinafter, the printed circuit board refers to a lower substrate (a substrate to which a memory chip is attached), which is located at a lower portion of a package substrate. However, this is merely an embodiment of the present disclosure, and an upper substrate of the package substrate may be formed in the following structure.

Referring to FIG. 2, the printed circuit board 100 according to the embodiment includes a first insulating layer 101, a circuit pattern 102, a conductive via 103, a second insulating layer 104, a third insulating layer 105, a first pad 106, a second pad 107, a protective layer 108, a solder ball 109, a memory chip 110, and a bump 114.

In this case, the bump 114 includes a first solder bump 113, a metal layer 112, and a second solder bump 111.

The first insulating layer 101 may be a core substrate.

Although the first insulating layer 101 may be a support substrate of the printed circuit board having a single circuit pattern formed thereon, the first insulating layer 101 may refer to a region in which any one circuit pattern is formed in a substrate having a plurality of lamination structures.

The first the third insulating layers 101, 104, and 105 form an insulating plate, and may be a thermosetting or thermoplastic polymeric substrate, a ceramic substrate, an organic-inorganic composite material substrate, or a glass fiber impregnated substrate. When the insulating layers include polymeric resin, the insulating layers may include epoxy-based insulating resin, such as FR-4, bismaleimide triazine (BT), or ajinomoto build up film (ABF). Alternatively, the insulating layers may include polyimide-based resin, but the present invention is not particularly limited thereto.

The first to third insulating layers 101, 104, and 105 may be formed of different materials. For example, the first insulating layer 101 may be a glass fiber impregnated substrate, and the second and third insulating layers 104 and 105 may include an insulating sheet formed of only resin.

The first insulating layer 101 is a center insulating layer, and may be formed thicker than the second and third insulating layers 104 and 105.

The circuit pattern 102 is formed on at least one of upper and lower surfaces of the first insulating layers 101.

The circuit pattern 102 may be formed through typical processes of manufacturing the printed circuit board, such as an additive process, a subtractive process, a modified semi-additive process (MSAP), and a semi-additive process (SAP), and detailed descriptions thereof will be omitted.

In addition, the conductive via 103 is formed inside the first insulating layer 101 to connect, to each other, circuit patterns formed in different layers from each other.

External circuit patterns (not shown) are also formed on both of the second insulating layer 104 formed on the first insulating layer 101 and the third insulating layer 105 formed under the first insulating layer 101.

The external circuit patterns may be the pads 106 and 107 shown in this figure. That is, the external circuit patterns are formed through the same process as the pads 106 and 107, and are classified into a pattern and a pad according to functions thereof.

In other words, metal patterns are formed on the surfaces of the second insulating layer 104 and the third insulating layer 105. According to the functions of the metal patterns, some of the circuit patterns may be external circuit patterns and the other circuit patterns may be the pads 106 and 107 connected to a chip or another substrate.

In addition, conductive vias are also formed inside the second and third insulating layers 104 and 105.

The conductive via 103 may be formed by forming, through a laser process, a via hole through which at least one of the first, second, and third insulating layers 101, 104, and 105 are opened, and filling metallic paste in the formed via hole.

In this case, the metallic material constituting the conductive via 103 may be any one material selected from the group consisting of Cu, Ag, Sn, Au, Ni and Pd. The filling of the metallic material may be performed through any one of electroless plating, electrolytic plating, screen printing, sputtering, evaporation, inkjetting, and dispensing, or a combination thereof.

Meanwhile, the via hole may be formed through any one of a machining process, a laser process, and a chemical process.

A milling process, a drill process, and a routing process may be used when the via hole is formed through the machining process, a UV laser scheme or a Co2 laser scheme may be used when the via hole is formed through the laser process, and chemicals including aminosilane or ketones may be used when the via hole is formed through the chemical process, thereby opening the first, second, and third insulating layers 101, 104, and 105.

Meanwhile, the laser process is a cutting scheme that concentrates optical energy onto a surface to melt and evaporate a portion of a material so that the material is formed in a desired shape. According to the laser process, even a complex shape can be easily processed in a computer program, and a composite material, which may be not cut through another scheme, can be processed.

In addition, the laser process enables a cutting diameter to be 0.005 mm or more, and has a wide processing thickness range.

Preferably, a YAG (Yttrium Aluminum Garnet) laser, a CO2 laser, or an ultraviolet laser may be used for a laser process drill. The YAG laser is a laser capable of processing both of a copper layer and an insulating layer, and the CO2 laser is a laser capable of processing only the insulating layer.

The protective layer 108 is formed on the surfaces (surfaces exposed to the outside or surfaces having the pad formed thereon) of the second and third insulating layers 104 and 105.

The protective layer 108 has an opening to expose an upper surface of the first pad 106.

That is, the protective layer 108 is used to protect the surfaces of the second and third insulating layers 104 and 105. The protective layer 108 is formed throughout the entire surfaces of the second and third insulating layers 104 and 105. The protective layer 108 has an opening to open an upper surface of a lamination structure of the first pad 106.

The protective layer 108 may include at least one layer formed using at least one of solder resist (SR), oxide, and Au.

The first pads 106 exposed through the openings of the protective layer 108 are classified into various pads according to functions thereof.

That is, the first pads 106 are classified into a pad connected to a chip attached to the inside and a pad connected to an external substrate.

Thus, the solder ball 109 is formed on the pad connected to the chip attached to the inside, and the memory chip 110 is formed on the solder ball 109.

In addition, the bump 114 is formed on the pad (hereinafter, referred to as a first pad) connected to the external substrate among the first pads 106.

The bump 114 is formed on the first pad 106, to protrude from an upper surface of the protective layer 108.

The bump 114 may be formed in the shape of a cylindrical post, a square post, etc. Alternatively, the bump 114 may be formed in the shape of a polygonal post.

The bump 114 includes the first solder bump 113, a metal layer 112, and a second solder bump 111.

The first solder bump 113 is formed on the first pad 106. The first solder bump 113 may be formed such that upper and lower surfaces thereof have areas different from each other.

That is, the upper surface of the first solder bump 113 is formed to extend to the upper surface of the protective layer 108.

The first solder bump 113 is formed as a material having a heterogeneous element is contained in a solder. In this case, the melting point of the first solder bump 113 is determined according to a content of the heterogeneous element.

In this embodiment, the content of the heterogeneous element is adjusted such that the first solder bump 113 has a first melting point.

Meanwhile, the solder may include at least one of SnCu, SnPb, and SnAgCu. In addition, the material having the heterogeneous element may include any one selected from the group consisting of Al, Sb, Bi, Cu, Ni, In, Pb, Ag, Sn, Zn, Ga, Cd, and Fe.

The metal layer 112 is formed on the first solder bump 113.

The metal layer 112 may be formed of a metallic material including copper. The metal layer 112 may be formed such that upper and lower surfaces thereof have the same area.

The second solder bump 111 is formed on the metal layer 112.

The second solder bump 111 is formed on the metal layer 112, so that adhesion between the printed circuit board and the upper substrate is provided later.

The second solder bump 111 may be formed in a shape in which the upper and lower surfaces thereof have the same area.

Like the first solder bump 113, the second solder bump 111 is formed as a material having a heterogeneous element is contained in a solder. In this case, the melting point of the second solder bump 111 is formed different from that of the first solder bump 113. The melting point of the second solder bump 111 is determined according to a content of the heterogeneous element.

That is, in this embodiment, the content of the heterogeneous element is adjusted such that the melting point of the second solder bump 111 has a second melting point different from the first melting point of the first solder bump 113.

Meanwhile, the solder may include at least one of SnCu, SnPb, and SnAgCu. In addition, the material having the heterogeneous element may include any one selected from the group consisting of Al, Sb, Bi, Cu, Ni, In, Pb, Ag, Sn, Zn, Ga, Cd, and Fe.

In this case, the first melting point is higher than the second melting point.

That is, a soldering process through a reflow process of the second solder bump 111 is to be performed in a process of attaching the upper substrate onto the bump 114 after the bump 114 is formed.

In this case, if the melting points of the first and second solder bumps 113 and 111 are equal to each other or if the melting point of the first solder bump 113 is lower than that of the second solder bump 111, there occurs a phenomenon that the first solder bump 113 is melted together with the second solder bump 111 in the reflow process of the second solder bump 111.

Thus, in the present invention, as the melting point of the first solder bump 113 is higher than that of the second solder bump 111, the shape of the first solder bump 113 can be maintained as it is in the reflow process of the second solder bump 111.

In addition, the above-described bump structure includes a plurality of solder bumps, and hence stresses generated in the package substrate can be easily absorbed.

That is, the first solder bump 113 is substantially formed on the lower substrate, and the second solder bump 111 is formed under the upper substrate.

Accordingly, the first solder bump 113 absorbs a stress applied toward the lower substrate among the stresses generated in the package substrate, and the second solder bump 111 absorbs a stress applied toward the upper substrate among the stresses generated in the package substrate.

As described above, according to the embodiment of the present invention, a bump including a plurality of solders having different melting characteristics is provided at an upper end of the lower substrate, so that any separate solder is not necessary for the upper substrate. Accordingly, an assembly process can be simplified, and simultaneously, the added value of substrate manufacturers can be increased.

In addition, according to the embodiment of the present invention, solders are formed at a bonding portion of the upper substrate and the lower substrate with the metal layer interposed therebetween, so that stresses applied to the entire package substrate can be absorbed by the solders. Accordingly, it is possible to prevent damage of the package substrate.

In addition, according to the embodiment of the present invention, a bump having a metal post structure is provided, so that a fine pitch can be formed.

Hereinafter, a method for manufacturing a printed circuit board according to an embodiment of the present invention will be described with reference to the accompanying drawings.

FIGS. 3 to 12 are sectional views illustrating a method for manufacturing a printed circuit board in sequence of processes according to a first embodiment of the present invention.

Figure 3:
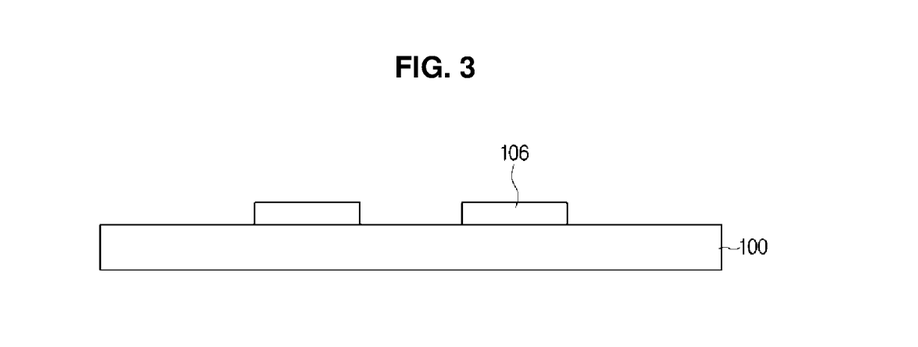
FIGS. 3 to 12 are sectional views illustrating a method for manufacturing a printed circuit board in sequence of processes according to a first embodiment of the present invention.

First, referring to FIG. 3, a base substrate 100 having a first pad 106 formed on a least one surface thereof is prepared.

In this case, the base substrate 100 refers to a substrate formed under the first pad 106 in the printed circuit board shown in FIG. 2.

That is, the base substrate 100 includes a first insulating layer 101, a circuit pattern 102, a conductive via 103, a second insulating layer 104, and a third insulating layer 105.

The preparing of the base substrate 100 may be performed by the following process.

First, the first insulating layer 101 is prepared. Then, after a via hole is formed in the prepared first insulating layer 101, the conductive via 103 buried in the via hole is formed.

In addition, the circuit pattern 102 is formed on at least one surface of the first insulating layer 101, to be connected to the conductive via 3.

After that, the second insulating layer 104 is formed on the first insulating layer 101, and the third insulating layer 105 is formed under the first insulating layer 101. In addition, conductive vias may also be formed in the second insulating layer 104 and the third insulating layer 105.

Figure 4:
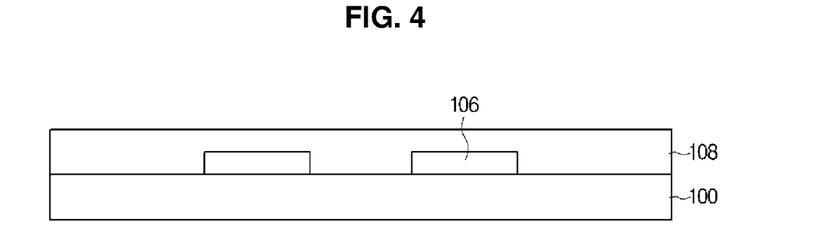

Next, referring to FIG. 4, a protective layer 108 is formed on the base substrate 100 having the first pad 106 formed thereon.

The protective layer 108 is used to protect a surface of the base substrate 100, the circuit pattern, and the first pad 106. The protective layer 108 may be formed in one or more layers using at least one of solder resist, oxide, and Au.

Figure 5:
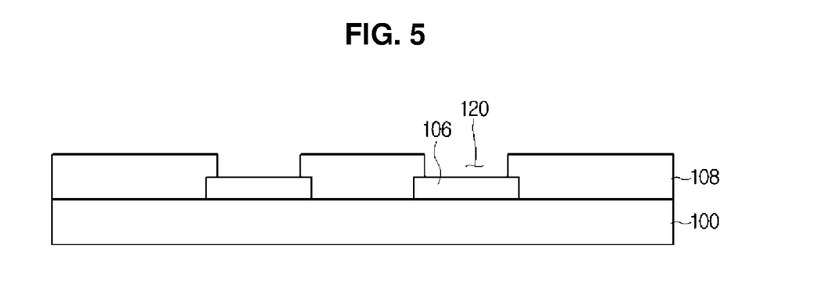

Next, referring to FIG. 5, the protective layer 108 is processed, thereby exposing an upper surface of the first pad 106 formed on the base substrate 100.

That is, a laser process is performed on the protective layer 108 formed on the base substrate 100, thereby forming an opening 120 through which the surface of the first pad 106 formed on the base substrate 100 is exposed.

The laser process has high flexibility of the process, and can process a complex shape or a small quantity of products without high molding cost. Moreover, the laser process is suitable for recent market situation of small quantity batch production. Thus, the laser process is frequently applied to processing of test products.

The laser process is a cutting scheme that concentrates optical energy onto a surface to melt and evaporate a portion of a material so that the material is formed in a desired shape. According to the laser process, even a complex shape can be easily processed in a computer program, and a composite material, which may be not cut through another scheme, can be processed. The laser process enables a cutting diameter to be 0.005 mm or more, and has a wide processing thickness range.

Preferably, a YAG (Yttrium Aluminum Garnet) laser, a CO2 laser, or an ultraviolet (UV) laser may be used for a laser process drill. The YAG laser is a laser capable of processing both of a copper layer and an insulating layer, and the CO2 laser is a laser capable of processing only the insulating layer.

In this case, the laser process is preferably performed using the ultraviolet (UV) laser, so that the opening 120 having a small diameter can be formed.

The position of the formed opening 120 is determined by a position of the first pad 106 formed on the base substrate 100.

That is, the opening 120 is formed to correspond to the position at which the first pad 106 is formed. In this case, the opening 120 may be formed to expose only a portion of the first pad 106 therethrough.

In other words, the opening 120 may be formed to have a width smaller than that of the first pad 106. Accordingly, an edge of the first pad 106 can be protected by the protective layer 108.

Figure 6:
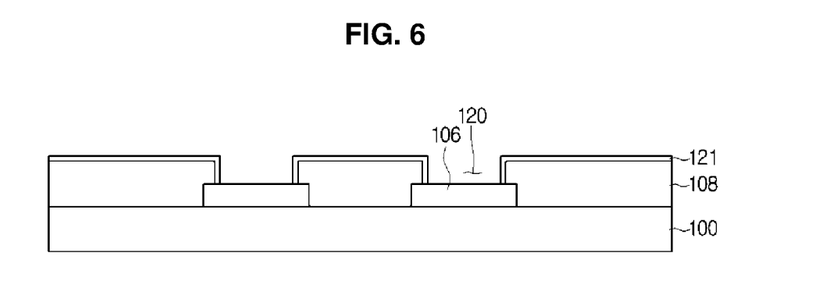

Next, referring to FIG. 6, a plating layer 121 is formed on upper and side surfaces of the protective layer 108. The plating layer 121 is a plating seed layer, and may be formed by chemical copper plating.

The chemical copper plating may be performed in the sequence of a degreasing process, a soft etching process, a pre-catalyst process, a catalyst treatment process, an accelerator process, an electroless plating process, and an anti-oxidation treatment process.

In addition, the copper plating is classified into heavy copper plating (2 μm or more), medium copper plating (1 to 2 μm), and light copper plating (1 μm or less) according to thicknesses of copper to be plated. Here, the plating layer 121 having a thickness of 0.5 μm to 1.5 μm is formed using the medium copper plating or light copper plating.

Meanwhile, before the plating layer 121 is formed, a desmear process performed as a wet and dry process may be performed so as to provide roughness to the upper surface of the protective layer 108.

Figure 7:
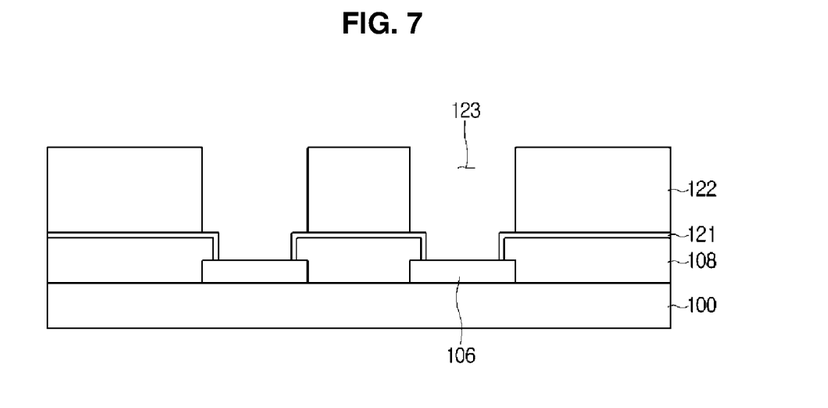

Next, referring to FIG. 7, a mask 122 is formed on the protective layer 108 having the plating layer 121 formed thereon. The mask 122 may be a dry film.

In this case, like the opening 120 of the protective layer 108, the mask 122 may have a window 123 exposing the surface of the first pad 106 therethrough.

In this case, the width of the window 123 is formed narrower than that of the opening 120.

Figure 8:
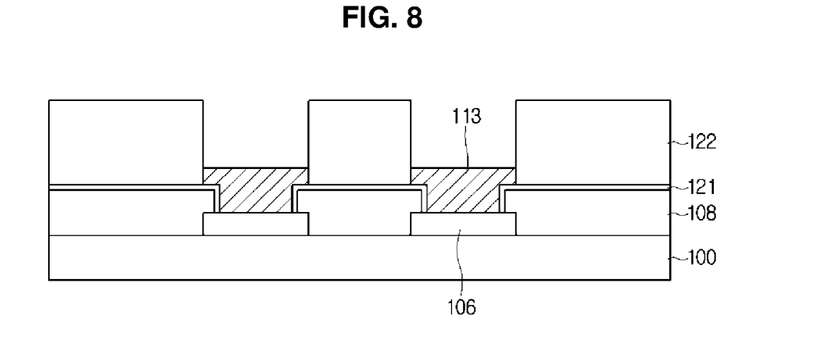

Next, referring to FIG. 8, a first solder bump 113 is formed on the first pad 106 to be buried in the opening 120 of the protective layer 108 and a portion of the window 123 of the mask 122.

The first solder bump 113 may be formed by plating a first metallic material using the plating layer 121 as a seed layer.

In this case, since the first solder bump 113 is also formed at a portion of the window 123, an upper surface of the first solder bump 113 is formed to extend to the upper surface of the protective layer 108.

The first metallic material for forming the first solder bump 113 includes a material having a heterogeneous element contained in a solder and a solder paste. In this case, the melting point of the first solder bump 113 is determined according to a content of the heterogeneous element.

In this embodiment, the content of the heterogeneous element is adjusted such that the first solder bump 113 has a first melting point.

Meanwhile, the solder may include at least one of SnCu, SnPb, and SnAgCu. In addition, the material having the heterogeneous element may include any one selected from the group consisting of Al, Sb, Bi, Cu, Ni, In, Pb, Ag, Sn, Zn, Ga, Cd, and Fe.

Figure 9:
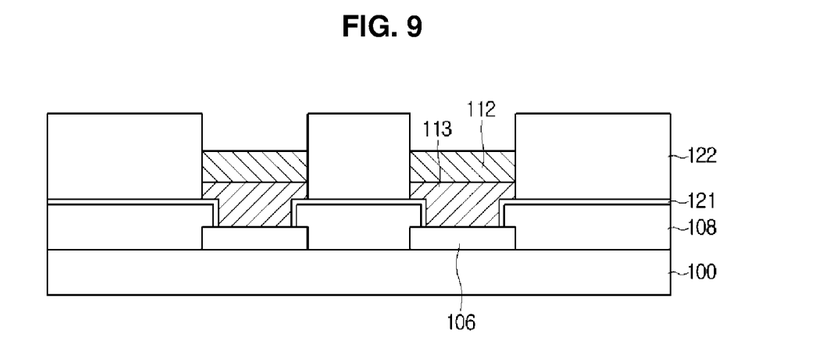

Next, referring to FIG. 9, a metal layer 112 buried in a portion of the window 123 is formed on the first solder bump 113.

The metal layer 112 may be formed of copper and an alloy thereof.

Figure 10:
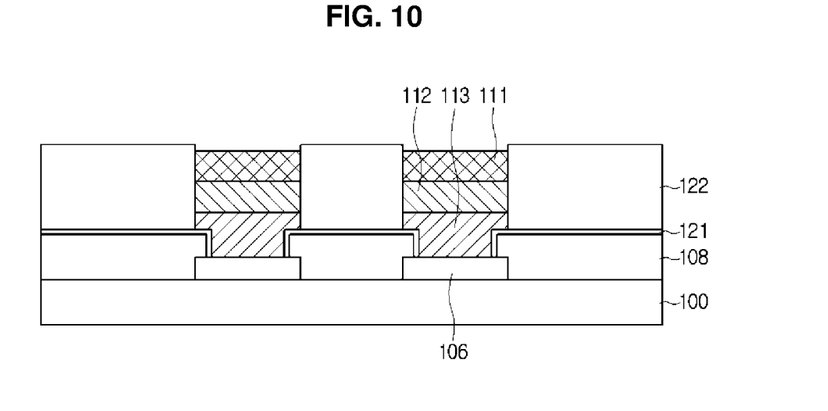

Next, referring to FIG. 10, a second solder bump 111 is formed on the metal layer 112.

The second solder bump 111 is formed on the metal layer 112, so that adhesion between the printed circuit board and the upper substrate is provided later.

The second solder bump 111 may be formed in a shape in which the upper and lower surfaces thereof have the same area.

Like the first solder bump 113, the second solder bump 111 is formed as a material having a heterogeneous element is contained in a solder. In this case, the melting point of the second solder bump 111 is formed different from that of the first solder bump 113. The melting point of the second solder bump 111 is determined according to a content of the heterogeneous element.

That is, in this embodiment, the content of the heterogeneous element is adjusted such that the melting point of the second solder bump 111 has a second melting point different from the first melting point of the first solder bump 113.

Meanwhile, the solder may include at least one of SnCu, SnPb, and SnAgCu. In addition, the material having the heterogeneous element may include any one selected from the group consisting of Al, Sb, Bi, Cu, Ni, In, Pb, Ag, Sn, Zn, Ga, Cd, and Fe.

In this case, the first melting point is higher than the second melting point.

That is, a soldering process through a reflow process of the second solder bump 111 is to be performed in a process of attaching the upper substrate onto the bump 114 after the bump 114 is formed.

In this case, if the melting points of the first and second solder bumps 113 and 111 are equal to each other or if the melting point of the first solder bump 113 is lower than that of the second solder bump 111, there occurs a phenomenon that the first solder bump 113 is melted together with the second solder bump 111 in the reflow process of the second solder bump 111.

Thus, in the present invention, as the melting point of the first solder bump 113 is higher than that of the second solder bump 111, the shape of the first solder bump 113 can be maintained as it is in the reflow process of the second solder bump 111.

In addition, the above-described bump structure includes a plurality of solder bumps, and hence stresses generated in the package substrate can be easily absorbed.

That is, the first solder bump 113 is substantially formed on the lower substrate, and the second solder bump 111 is formed under the upper substrate.

Accordingly, the first solder bump 113 absorbs a stress applied toward the lower substrate among the stresses generated in the package substrate, and the second solder bump 111 absorbs a stress applied toward the upper substrate among the stresses generated in the package substrate.

Figure 11:
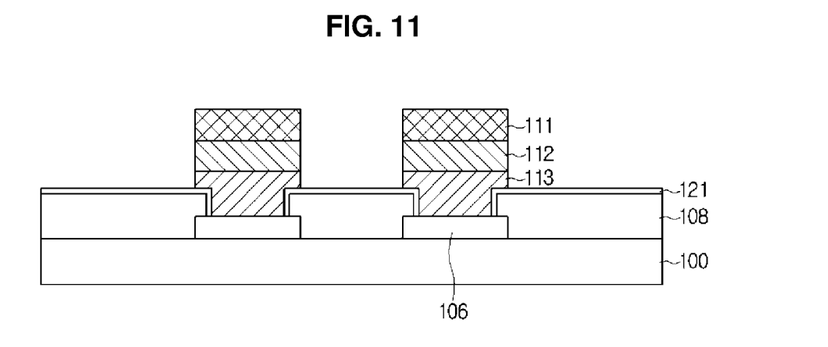

Next, referring to FIG. 11, the mask 122 formed on the protective layer 108 is removed.

Figure 12:
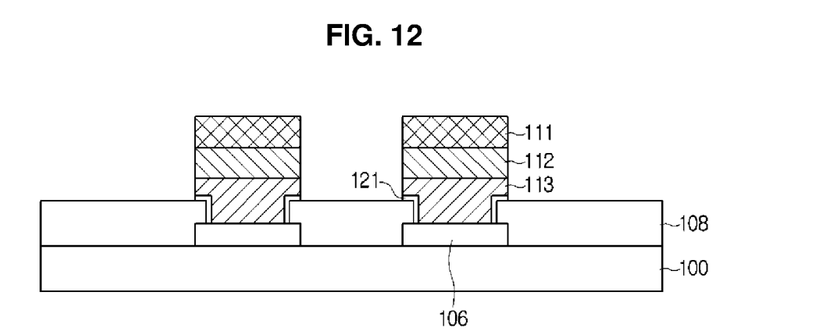

Next, as shown in FIG. 12, the plating layer 121 formed on the upper surface of the protective layer 108 is removed.

Figure 13:
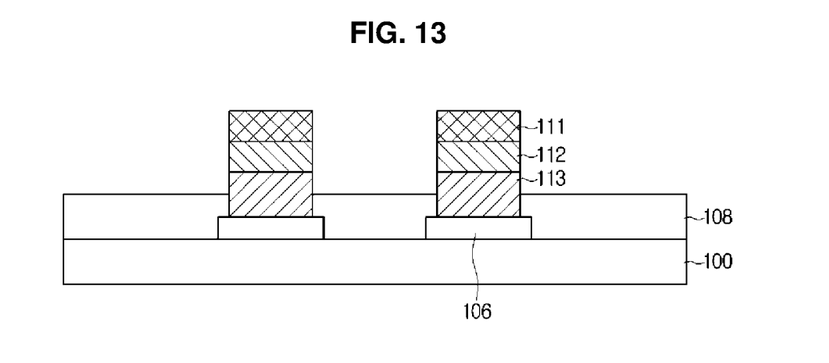
FIG. 13 illustrates a structure of a bump 114 according to a second embodiment of the present invention.

FIG. 13 illustrates a structure of a bump 114 according to a second embodiment of the present invention.

The bump 114 shown in FIG. 13 has a slightly different shape from the bump shown in FIGS. 2 to 13.

That is, the first bump 113 according to the first embodiment is formed such that the upper and lower surfaces thereof have areas different from each other.

However, a first bump 113 according to the second embodiment is formed such that upper and lower surfaces thereof have areas equal to each other.

This is achieved by forming the size of the window formed in the mask to be equal to that of the opening in the above-described process of forming the mask.

Figure 14:
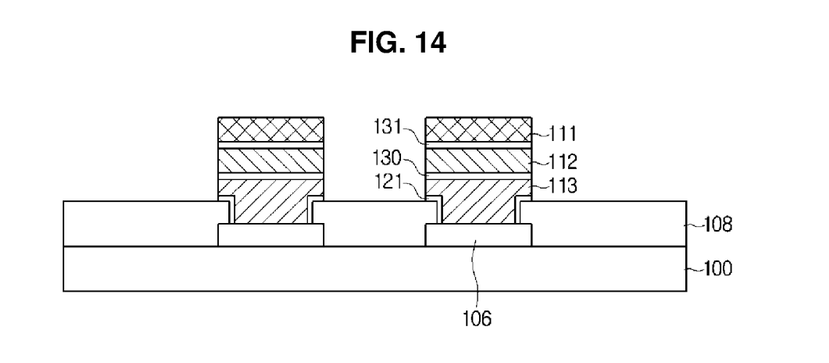
FIG. 14 illustrates a structure of a bump according to a second embodiment of the present invention.

FIG. 14 illustrates a structure of a bump according to a second embodiment of the present invention.

Referring to FIG. 14, the bump includes a first bump 113, a metal layer 112, and a second bump 111. Simultaneously, the bump further includes a first surface treatment layer 130 formed between the first bump 113 and the metal layer 112, and a second surface treatment layer 131 formed between the metal layer 112 and the second bump 111.

The first and second surface treatment layers 130 and 131 are formed to improve connectivity between the first bump 113, the metal layer 112, and the second bump 111.

The first and second surface treatment layers 130 and 131 may be formed of at least one metallic material selected from the group consisting of Si, Ti, Al, Mg, Zr, Mo, P, W, V, Ni, Ag, Au, and Cu, and an alloy of two or more thereof.

Figure 15:
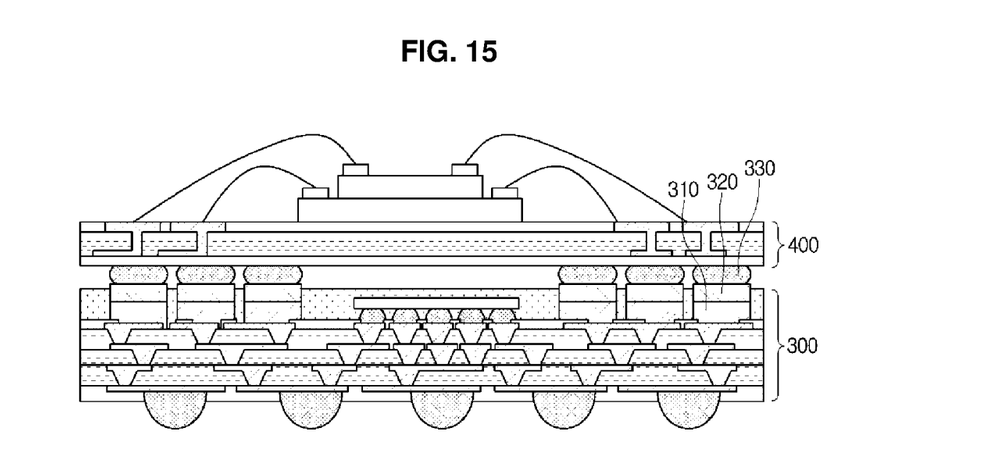
FIG. 15 is a sectional view illustrating a package substrate according to an embodiment of the present invention.

FIG. 15 is a sectional view illustrating a package substrate according to an embodiment of the present invention.

Referring to FIG. 15, the package substrate includes a lower substrate 300 and an upper substrate 400 attached onto the lower substrate 300.

In this case, the lower substrate 300 includes a bump for bonding the lower substrate 300 to the upper substrate 400.

The bump includes a first solder bump 310, a metal layer 320, and a second solder bump 330.

The first solder bump 310 is formed as a material having a heterogeneous element is contained in a solder. In this case, the melting point of the first solder bump 310 is determined according to a content of the heterogeneous element. In this embodiment, the content of the heterogeneous element is adjusted such that the first solder bump 310 has a first melting point.

Meanwhile, the solder may include at least one of SnCu, SnPb, and SnAgCu. In addition, the material having the heterogeneous element may include any one selected from the group consisting of Al, Sb, Bi, Cu, Ni, In, Pb, Ag, Sn, Zn, Ga, Cd, and Fe.

The metal layer 320 is formed on the first solder bump 310. The metal layer 320 may be formed of a metallic material including copper. The metal layer 320 may be formed such that upper and lower surfaces thereof have the same area.

The second solder bump 330 is formed on the metal layer 320.

The second solder bump 330 is formed on the metal layer 320. The second solder bump 330 may be formed in a shape in which upper and lower surfaces thereof have the same area.

Like the first solder bump 310, the second solder bump 330 is formed as a material having a heterogeneous element is contained in a solder. In this case, the melting point of the second solder bump 330 is formed different from that of the first solder bump 310. The melting point of the second solder bump 330 is determined according to a content of the heterogeneous element.

That is, in this embodiment, the content of the heterogeneous element is adjusted such that the melting point of the second solder bump 330 has a second melting point different from the first melting point of the first solder bump 310.

Meanwhile, the solder may include at least one of SnCu, SnPb, and SnAgCu. In addition, the material having the heterogeneous element may include any one selected from the group consisting of Al, Sb, Bi, Cu, Ni, In, Pb, Ag, Sn, Zn, Ga, Cd, and Fe.

In this case, the first melting point is higher than the second melting point.

That is, a soldering process through a reflow process of the second solder bump 330 is to be performed so as to attach the upper substrate onto the lower substrate.

In this case, if the melting points of the first and second solder bumps 310 and 330 are equal to each other or if the melting point of the first solder bump 310 is lower than that of the second solder bump 330, there occurs a phenomenon that the first solder bump 310 is melted together with the second solder bump 330 in the reflow process of the second solder bump 330.

Thus, in the present invention, as the melting point of the first solder bump 310 is higher than that of the second solder bump 330, the shape of the first solder bump 310 can be maintained as it is in the reflow process of the second solder bump 330.

In addition, the above-described bump structure includes a plurality of solder bumps, and hence stresses generated in the package substrate can be easily absorbed.

That is, the first solder bump 310 is substantially formed on the lower substrate, and the second solder bump 330 is formed under the upper substrate.

Accordingly, the first solder bump 310 absorbs a stress applied toward the lower substrate among the stresses generated in the package substrate, and the second solder bump 330 absorbs a stress applied toward the upper substrate among the stresses generated in the package substrate.

According to the embodiments of the present invention, a bump including a plurality of solders having different melting characteristics is provided at an upper end of the lower substrate, so that any separate solder is not necessary for the upper substrate. Accordingly, an assembly process can be simplified, and simultaneously, the added value of substrate manufacturers can be increased.

In addition, according to the embodiments of the present invention, solders are formed at a bonding portion of the upper substrate and the lower substrate with the metal layer interposed therebetween, so that stresses applied to the entire package substrate can be absorbed by the solders. Accordingly, it is possible to prevent damage of the package substrate.

In addition, according to the embodiments of the present invention, a bump having a metal post structure is provided, so that a fine pitch can be formed.

Although the embodiments of the present invention have been described, the description does not limit the present invention but merely explains the embodiments of the present invention. Further, it will be understood by those skilled in the art that various changes and modifications can be made thereto without departing from the technical spirit and scope of the present invention. These modified embodiments may be not individually understood from spirit or prospect of the invention.

The invention claimed is:

1. A printed circuit board comprising:
an insulating substrate;
a pad disposed on at least one surface of the insulating substrate;
a first protective layer disposed on the insulating substrate, the first protective layer having an opening exposing an upper surface of the pad therethrough;
a first solder bump disposed on the pad exposed by the first protective layer and including a solder, the first solder bump protruding upward from a top surface of the first protective layer;
a metal layer disposed on the first solder bump; and
a second solder bump disposed on the metal layer and including a solder, and configured to directly couple to a lower surface of a second protective layer of an upper printed circuit board,
an electronic device attached onto the insulating substrate;
a molding layer provided to encapsulate the electronic device, the first solder bump and a part of the metal layer to be buried in the molding layer,
wherein a melting point of the first solder bump is different from a melting point of the second solder bump,
wherein the first solder bump is formed as a material having a heterogeneous element comprising at least one selected from the group consisting of Al, Sb, Bi, Cu, Ni, In, Pb, Ag, Sn, Zn, Ga, Cd, and Fe is contained in a solder comprising at least one of SnCu, SnPb, and SnAgCu,
wherein the second solder bump is formed as a material having a heterogeneous element comprising at least one selected from the group consisting of Al, Sb, Bi, Cu, Ni, In, Pb, Ag, Sn, Zn, Ga, Cd, and Fe is contained in a solder comprising at least one of SnCu, SnPb, and SnAgCu, and
wherein a content of the heterogeneous element of the first solder bump and a content of the heterogeneous element of the second solder bump are adjusted such that the melting point of the second solder bump is different from the melting point of the first solder bump,
wherein an entire top surface of the second solder bump is in direct physical contact with the lower surface of the second protective layer,
wherein a top surface of the first solder bump is positioned at a lower level than a top surface of the molding layer,
wherein a bottom surface of the metal layer is positioned at a lower level than the top surface of the molding layer, and
wherein the top surface of the molding layer is positioned at a lower level than a top surface of the metal layer.

2. The printed circuit board according to claim 1, wherein the melting point of the first solder bump is higher than that of the second solder bump.

3. The printed circuit board according to claim 1, further comprising:

a first surface treatment layer disposed between the first solder bump and the metal layer; and
a second surface treatment layer disposed between the metal layer and the second solder bump.

4. The printed circuit board according to claim 1, wherein the first solder bump further comprises a plating seed layer disposed on an inner wall of the opening and a partial upper surface of the protective layer.

5. A package substrate comprising:
a lower substrate having a first chip mounted thereon;
an upper substrate disposed on the lower substrate, the upper substrate having a second chip mounted thereon, and
a molding layer disposed between the lower substrate and the upper substrate, the molding layer allowing the first chip of the lower substrate to be buried therein,
wherein the lower substrate comprises:
an insulating substrate;
a pad disposed on at least one surface of the insulating substrate;
a first protective layer disposed on the insulating substrate, the first protective layer having an opening exposing an upper surface of the pad therethrough;
a first solder bump disposed on the pad exposed by the first protective layer;
a metal layer disposed on the first solder bump; and
a second solder layer formed on the metal layer and configured to directly couple to a lower surface of a second protective layer of the upper substrate,
wherein a melting point of the first solder bump is different from a melting point of the second solder bump,
wherein the first solder bump is formed as a material having a heterogeneous element comprising at least one selected from the group consisting of Al, Sb, Bi, Cu, Ni, In, Pb, Ag, Sn, Zn, Ga, Cd, and Fe is contained in a solder comprising at least one of SnCu, SnPb, and SnAgCu,
wherein the second solder bump is formed as a material having a heterogeneous element comprising at least one selected from the group consisting of Al, Sb, Bi, Cu, Ni, In, Pb, Ag, Sn, Zn, Ga, Cd, and Fe is contained in a solder comprising at least one of SnCu, SnPb, and SnAgCu,
wherein a content of the heterogeneous element of the first solder bump and a content of the heterogeneous element of the second solder bump are adjusted such that the melting point of the second solder bump is different from the melting point of the first solder bump,
wherein an entire top surface of the second solder bump is in direct physical contact with the lower surface of the second protective layer,
wherein a top surface of the first solder bump is positioned at a lower level than a top surface of the molding layer,
wherein a bottom surface of the metal layer is positioned at a lower level than the top surface of the molding layer, and
wherein the top surface of the molding layer is positioned at a lower level than a top surface of the metal layer.

6. The package substrate according to claim 5, further comprising:
a first surface treatment layer disposed between the first solder bump and the metal layer; and a second surface treatment layer disposed between the metal layer and the second solder bump.

7. A method for manufacturing a package substrate, the method comprising:

preparing a base substrate;

forming a pad on at least one surface of the prepared base substrate;

forming, on the base substrate, a first protective layer having an opening exposing a surface of the pad therethrough;

forming, on the first protective layer, a mask having a window exposing the surface of the pad;

forming, on the pad, a first solder bump buried in the opening and a portion of the window;

forming, a metal layer, on the first solder bump;

forming, on the metal layer, a second solder bump buried in the window; and forming, on the base substrate, a molding layer provided to encapsulate the first solder bump and a part of the metal layer to be buried in the molding layer, wherein a melting point of the first solder bump is different from a melting point of the second solder bump, wherein the first solder bump is formed as a material having a heterogeneous element comprising at least one selected from the group consisting of Al, Sb, Bi, Cu, Ni, In, Pb, Ag, Sn, Zn, Ga, Cd, and Fe is contained in a solder comprising at least one of SnCu, SnPb, and SnAgCu, wherein the second solder bump is formed as a material having a heterogeneous element comprising at least one selected from the group consisting of Al, Sb, Bi, Cu, Ni, In, Pb, Ag, Sn, Zn, Ga, Cd, and Fe is contained in a solder comprising at least one of SnCu, SnPb, and SnAgCu, wherein a content of the heterogeneous element of the first solder bump and a content of the heterogeneous element of the second solder bump are adjusted such that the melting point of the second solder bump is different from the melting point of the first solder bump, wherein the second solder bump is configured to directly couple to a lower surface of a second protective layer of an upper printed circuit board, wherein an entire top surface of the second solder bump is in direct physical contact with the lower surface of the second protective layer, wherein a top surface of the first solder bump is positioned at a lower level than a top surface of the molding layer, wherein a bottom surface of the metal layer is positioned at a lower level than the top surface of the molding layer, and wherein the top surface of the molding layer is positioned at a lower level than a top surface of the metal layer.

8. The method according to claim 7, further comprising:

forming a first surface treatment layer between the first solder bump and the metal layer; and forming a second surface treatment layer between the metal layer and the second solder bump.

9. The method according to claim 7, further comprising performing a reflow process based on the melting point of the second solder bump, thereby attaching an upper substrate onto the second solder bump, wherein, in the reflow process, the shape of the first solder bump is maintained as it is.

* * * * *